United States Patent [19]

Steffes

[11] Patent Number: 5,722,741
[45] Date of Patent: Mar. 3, 1998

[54] ELECTROHYDRAULIC PRESSURE CONTROL DEVICE

[75] Inventor: Helmut Steffes, Hattersheim, Germany

[73] Assignee: ITT Automotive Europe GmbH, Germany

[21] Appl. No.: 545,639

[22] PCT Filed: Apr. 13, 1994

[86] PCT No.: PCT/EP94/01135

§ 371 Date: Oct. 30, 1995

§ 102(e) Date: Oct. 30, 1995

[87] PCT Pub. No.: WO94/25320

PCT Pub. Date: Nov. 10, 1994

[30] Foreign Application Priority Data

Apr. 30, 1993 [DE] Germany ............ 43 14 312.1

[51] Int. Cl.[6] .................................................. B60T 8/36
[52] U.S. Cl. .................. 303/119.2; 439/140; 439/248
[58] Field of Search .......................... 303/119.2, 113.1, 303/116.4; 439/248, 49, 34, 140, 141, 449; 137/596.17

[56] References Cited

U.S. PATENT DOCUMENTS

| 4,083,902 | 4/1978 | Clyde . |
| 4,249,229 | 2/1981 | Hester . |
| 5,127,440 | 7/1992 | Maas et al. . |
| 5,516,303 | 5/1996 | Yohn et al. ............. 439/248 |
| 5,520,447 | 5/1996 | Burgdorf et al. ............. 303/119.2 |
| 5,520,546 | 5/1996 | Klinger et al. ............. 439/140 |
| 5,580,263 | 12/1996 | Kourimsky ............. 439/248 |

FOREIGN PATENT DOCUMENTS

| 3420127 | 5/1984 | Germany . |
| 3629226 | 8/1986 | Germany . |
| 3640760 | 11/1986 | Germany . |
| 3743594 | 12/1987 | Germany . |
| 3825935 | 2/1989 | Germany . |
| 4001017 | 1/1990 | Germany . |
| 4018179 | 6/1990 | Germany . |
| 4108079 | 3/1991 | Germany . |
| 4135745 | 10/1991 | Germany . |
| 0499670 | 8/1992 | Germany . |
| 618054 | 12/1976 | Switzerland . |
| WO8910286 | 11/1989 | WIPO . |
| WO9208630 | 5/1992 | WIPO . |
| WO9212878 | 8/1992 | WIPO . |
| WO9222104 | 12/1992 | WIPO . |

*Primary Examiner*—Matthew C. Graham
*Attorney, Agent, or Firm*—J. Gordon Lewis; Thomas N. Twomey

[57] ABSTRACT

An electrohydraulic pressure control device including electromagnetically operable hydraulic valves (solenoid valves) which are arranged on a valve-accommodating member, coils which project from the valve-accommodating member, the coils having electric contact elements on their parts projecting from the valve-accommodating member, a cover which covers the projecting coil parts and the contact elements, a carrier element to accommodate the coils, with projections being shaped on the bottom side of the substantially plate-shaped carrier element close to the coils, which projections enclose the electric contact elements projecting from the coils, the projections having cavities for accommodating adhesive material which establishes a connection with the projections by enclosing the contact elements in an operative manner.

7 Claims, 1 Drawing Sheet

ELECTROHYDRAULIC PRESSURE CONTROL DEVICE

TECHNICAL FIELD

The present invention relates to an electrohydraulic pressure control device, and in particular relates to a braking pressure control device and a method of manufacturing a pressure control device of this type.

BACKGROUND OF THE INVENTION

A generic electrohydraulic pressure control device is described as an example in international publication WO 92/12878 wherein, apart from the sufficiently known modular construction of the valve-accommodating member, the cover is subdivided by a plate-shaped carrier element to accommodate an electronic controller or parts of an electronic controller, on the one hand, and to establish the electrical connection between the electronic controller and the contact elements projecting from the solenoid valves, on the other hand. The cover along with the coils of the solenoid valves is plugged onto the valve domes of the valve-accommodating member, and plug contacts engage into each other for providing the electrical connection between the contact elements and the electronic or electric components integrated in the cover. To attach the coils to the carrier element, it is suggested using elastic attaching means, for example springs, or embedding the coils in an elastic shaped member. Both variants require simplification.

Thus, an object of the present invention is to improve the pressure control device disclosed in the mentioned prior art and to provide a compact and functionally optimized assembly of the coils on the carrier element which permits maximum ease of manufacture and testing and allows receiving different heat expansions of the component parts with least possible tension. In addition, an appropriate method of manufacturing a pressure control device of this type is to be achieved.

This object is achieved by arranging projections on the bottom side of the carrier element close to the coils to enclose the electric contact elements that project from the coils, the projections having cavities to receive adhesive material which establishes an operative connection with the projections by enclosing the contact elements. Regarding the manufacturing method, it is suggested to provide the contact elements or the cavities in the projections with an adhesive material in the form of hot-setting adhesive pills. After soldering of the electric conducting paths, the pills are melted, and the carrier element, for the purpose of anti-corrosion conservation of the electric contacts, having a quickly hardening sealing compound or, alternatively, a frame bounding the carrier element forms a covering which is either cemented or welded to the carrier element.

DETAILED DESCRIPTION OF THE PREFERRED EMBODIMENTS

Figure 1:
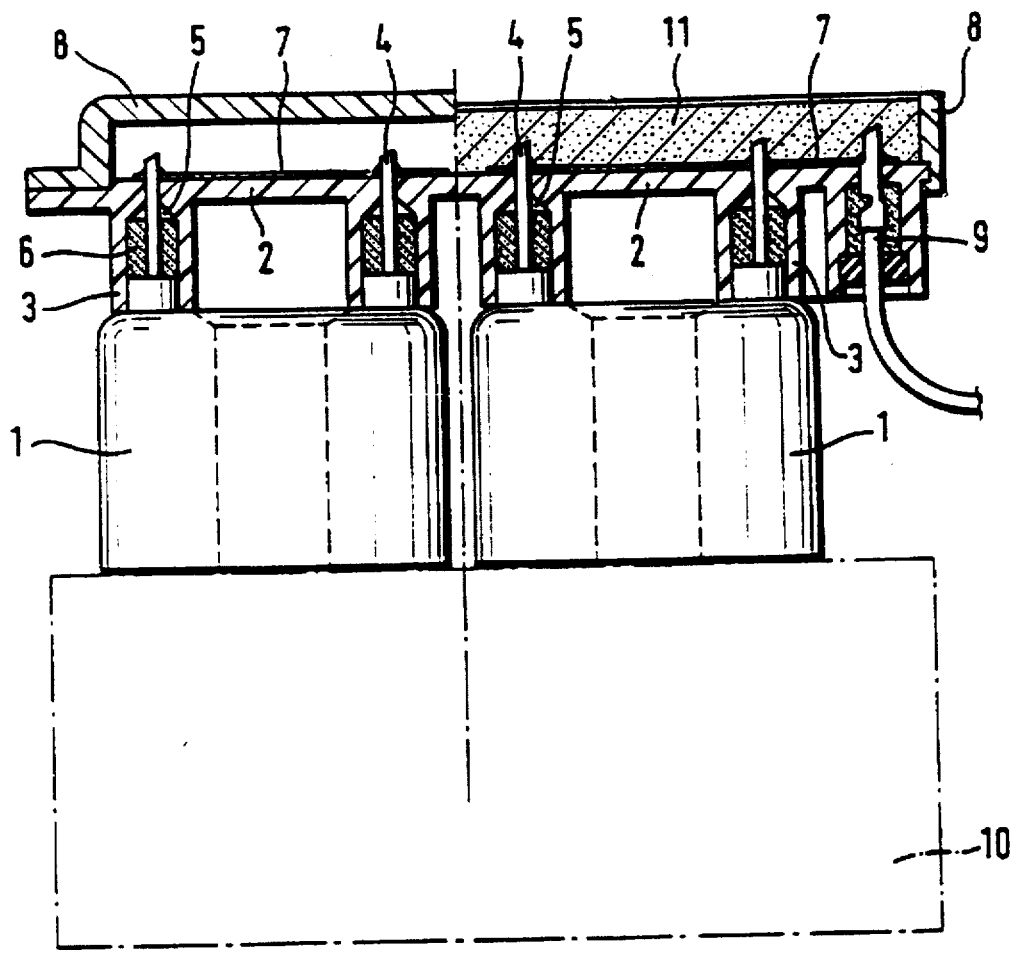
FIG. 1 is a partial cross-section of two alternative embodiments, united in a side view of the pressure control device according to the present invention.

FIG. 1 shows a side view of the pressure control device according to the present invention in which the basic components are outlined. The left-hand half of the pressure control device, illustrated with respect to the vertical axis of symmetry of the elements, in a first embodiment includes a cover shown in profiled cross-section. The cover has a carrier element 2 including a plurality of conducting paths 7 and a frame 8 formed on top of it as a covering. The right-hand half of the pressure control device, illustrated with respect to the vertical axis of symmetry of the elements, shows another alternative embodiment of the coil covering, where the carrier element 2 including the conducting paths 7 has a frame 8 in which an anti-corrosion sealing compound 11 is filled for covering the conducting paths 7 and the coil contact elements 4 connected to them. Irrespective of the chosen individual view on the two design variants for the covering of the coils, the carrier element 2 is provided as a printed circuit board placed substantially horizontally on the contact elements 4 of the coils and having projections 3 shaped on its bottom side which cover the contact elements 4 projecting from the coils 1. Cavities 5 formed between the contact elements 4 and the sleeve-shaped projections 3 preferably accommodate adhesive materials 6 in the form of hot-setting adhesive pills which establish an operatively enclosing connection between the carrier element 2 and the coil 1.

A block-shaped valve-accommodating member 10 is made of either steel or of light metal and has valve domes which are shown in broken lines. The coils 1, which are elastically fixed on the carrier element 2, are placed on the valve domes arranged in two parallel rows. Because the carrier element 2 is a printed circuit board, the electric plug connection 9 connected to the conducting paths 7 can preferably be shaped as a homogeneous component part of the carrier element 2 for connection of a peripheral cable loom. The contact elements 4 of the coils 1 are soldered in the punched-out portions in the carrier element 2 or in the conducting paths.

Figure 2:
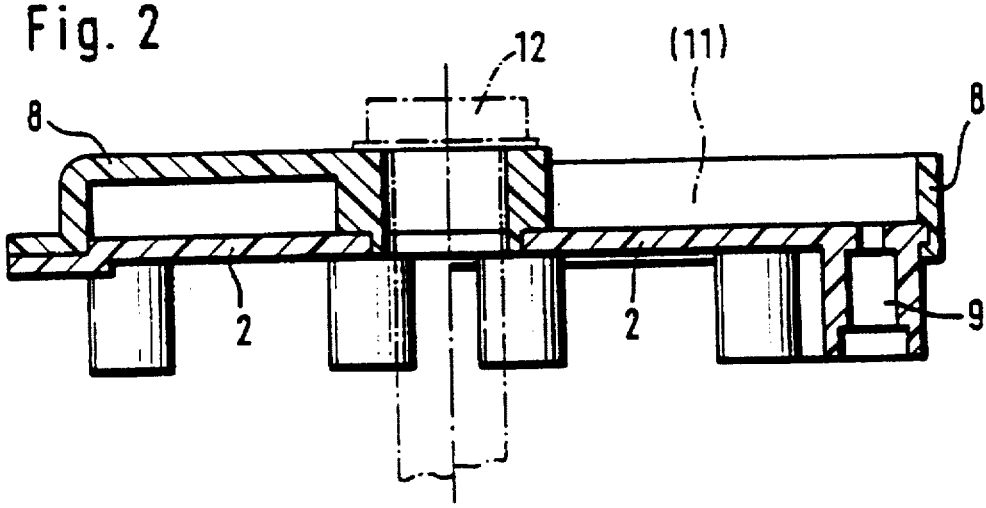
FIG. 2 is a view, in a cross-sectional plane, lying behind the two coils in FIG. 1, of the arrangement of the attaching element for the two alternative embodiments of the carrier element.

FIG. 2 shows a profiled section of the carrier element 2 which is offset vertically and, thus, in the direction of the drawing plane, the section extending between two pairs of coils lying one behind the other. As can be seen in FIG. 1, the carrier element 2 also shows the two alternative embodiments with respect to the frame covering. On the left in the drawing the frame 8 formed as a closed covering can be seen. Frame 8 is provided as an open frame part for accommodation of the sealing compound 11 on the right hand in the drawing. The carrier element 2 is penetrated in its middle by an attaching element 12 provided as a screw and fixing the carrier element 2 with the coils 1 on the valve-accommodating member 10. Frame 8 formed as a covering is either cemented on the carrier element 2, or welded to the carrier element provided that identical materials (plastic) are used. In case an open frame 8 is used, a sealing compound 11 which hardens as quickly as possible is desirable, UV-radiation fostering quick hardening.

The described pressure control device permits relative ease of adapting individual components to different manufacturing requirements. The necessary electric or electronic components and parts herefor (carrier plate, contacting means), as a separate assembly group "electrics", are adapted optimally to the respective requirements of the hydraulic part (valve block). In addition, the previously described molecular connection between the carrier element, the coils and the frame covering permits adapting all elements to the presently practiced manufacturing technology in a favorable manner. Besides, mechanical stress, among others caused by thermomechanical tension, can be minimized by elastically or, if necessary, also plastically fixing the coils on the carrier element.

I claim:

1. Electrohydraulic pressure control device, comprising:
   electromagnetically operable hydraulic valves arranged on a valve-accommodating member,
   coils which project from the valve-accommodating member, the coils having electric contact elements on their parts projecting from the valve-accommodating member,
   a cover which covers the projecting coil parts and the contact elements,
   a carrier element for accommodating the coils which is arranged within the cover, wherein said carrier element includes projections formed on the bottom side of the carrier element, which bottom side faces the coils and wherein said projections substantially enclose said electric contact elements of said coils, and wherein the carrier element projections include cavities for accommodating adhesive material which establishes a connection with the projections by enclosing the contact elements in an operative manner.

2. Electrohydraulic pressure control device as claimed in claim 1 further including another projection of the carrier element formed to provide an electric plug connection.

3. Electrohydraulic pressure control device as claimed in claim 1, further including electric conducting paths bounded by a frame and arranged on an upper side of the carrier element.

4. Electrohydraulic pressure control device as claimed in claim 3 wherein at least one attaching element extends through the carrier element with the frame and fixes the carrier element on the valve-accommodating member.

5. Electrohydraulic pressure control device as claimed in claim 3, wherein the frame accommodates an anti-corrosion sealing compound which covers the conducting paths and the contact elements.

6. Electrohydraulic pressure control device as claimed in claim 3 wherein the frame is formed of a covering which encloses the conducting paths and is cemented or welded with the carrier element to form a cover.

7. Electrohydraulic pressure control device as claimed in claim 3 wherein the frame and the carrier element are made of an elastic plastic compound.

* * * * *